United States Patent
Yabuta et al.

(10) Patent No.: US 11,842,968 B2
(45) Date of Patent: *Dec. 12, 2023

(54) POWER SEMICONDUCTOR DEVICE AND SUBSTRATE WITH DIMPLE REGION

(71) Applicant: MITSUBISHI ELECTRIC CORPORATION, Tokyo (JP)

(72) Inventors: Kohei Yabuta, Tokyo (JP); Takayuki Yamada, Tokyo (JP); Yuya Muramatsu, Tokyo (JP); Noriyuki Besshi, Tokyo (JP); Yutaro Sugi, Tokyo (JP); Hiroaki Haruna, Tokyo (JP); Masaru Fuku, Tokyo (JP); Atsuki Fujita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/732,751

(22) Filed: Apr. 29, 2022

(65) Prior Publication Data
US 2022/0254738 A1 Aug. 11, 2022

Related U.S. Application Data

(63) Continuation of application No. 16/647,886, filed as application No. PCT/JP2018/039659 on Oct. 25, 2018, now Pat. No. 11,342,281.

(30) Foreign Application Priority Data

Oct. 30, 2017 (JP) .................................. 2017-209200

(51) Int. Cl.
*H01L 23/00* (2006.01)
*H01L 21/48* (2006.01)
*H01L 23/13* (2006.01)

(52) U.S. Cl.
CPC ........ *H01L 23/562* (2013.01); *H01L 21/4878* (2013.01); *H01L 23/13* (2013.01);
(Continued)

(58) Field of Classification Search
None
See application file for complete search history.

(56) References Cited

U.S. PATENT DOCUMENTS 5,271,887 A * 12/1993 Wiech, Jr. ............... H05K 3/101
257/E23.101
5,510,634 A   4/1996 Okabe et al.
(Continued)

FOREIGN PATENT DOCUMENTS

DE   102016118784 A1 *  4/2018  ............ H01L 21/56
EP       1995774 A2 * 11/2008  ............ H01L 23/13
(Continued)

OTHER PUBLICATIONS

Office Action issued in corresponding Chinese Patent Application No. 201880068708.7, dated Feb. 15, 2023, 20 pages including 12 pages of English translation.
(Continued)

*Primary Examiner* — Scott B Geyer
(74) *Attorney, Agent, or Firm* — BUCHANAN INGERSOLL & ROONEY PC (57) ABSTRACT

A power semiconductor device includes a substrate and a semiconductor element bonded onto a first surface of the substrate through use of a sintered metal bonding material. The substrate has a plurality of dimples formed in the first surface and located outside a location immediately below a heat generation unit of the semiconductor element. The sintered metal bonding material is supplied onto the substrate after the formation of the dimples, and the semicon-
(Continued)

ductor element is bonded to the substrate through application of heat and a pressure thereto.

7 Claims, 6 Drawing Sheets

(52) U.S. Cl.
CPC .............. *H01L 24/29* (2013.01); *H01L 24/83* (2013.01); *H01L 2224/29021* (2013.01); *H01L 2224/29239* (2013.01); *H01L 2224/29244* (2013.01); *H01L 2224/29247* (2013.01); *H01L 2224/29264* (2013.01); *H01L 2224/29269* (2013.01); *H01L 2224/8384* (2013.01); *H01L 2924/1033* (2013.01); *H01L 2924/10253* (2013.01); *H01L 2924/10272* (2013.01); *H01L 2924/1203* (2013.01); *H01L 2924/13055* (2013.01); *H01L 2924/13091* (2013.01); *H01L 2924/35121* (2013.01)

(56) References Cited

U.S. PATENT DOCUMENTS

| | | | |
|---|---|---|---|
| 5,602,720 A * | 2/1997 | Natsuhara | H01L 23/3735 361/708 |
| 5,654,586 A * | 8/1997 | Schwarzbauer | H01L 24/83 257/E23.109 |
| 6,670,222 B1 | 12/2003 | Brodsky | |
| 7,355,853 B2 * | 4/2008 | Emoto | H01L 23/3735 361/704 |
| 11,450,794 B2 * | 9/2022 | Altieri-Weimar | H01L 33/486 |
| 2002/0145180 A1 * | 10/2002 | Terui | H01L 24/32 257/676 |
| 2011/0309512 A1 * | 12/2011 | Gejima | H01L 23/053 257/771 |
| 2012/0061815 A1 | 3/2012 | Sontheimer et al. | |
| 2012/0306087 A1 | 12/2012 | Bayerer et al. | |
| 2013/0001803 A1 | 1/2013 | Mengel et al. | |
| 2015/0041827 A1 | 2/2015 | Iwata et al. | |
| 2017/0133315 A1 * | 5/2017 | Kawazu | H01L 21/481 |
| 2017/0317048 A1 * | 11/2017 | Matsubara | C22C 19/03 |
| 2017/0323844 A1 | 11/2017 | Karlicek | |
| 2018/0102303 A1 * | 4/2018 | Mori | B32B 7/04 |
| 2018/0190611 A1 | 7/2018 | Tatsumi et al. | |
| 2018/0197833 A1 | 7/2018 | Sakakibara | |
| 2018/0366383 A1 * | 12/2018 | Yokoyama | H01L 23/13 |
| 2020/0135682 A1 * | 4/2020 | Ishikawa | H01L 23/12 |
| 2020/0176342 A1 * | 6/2020 | Choi | H01L 23/49517 |
| 2020/0251423 A1 | 8/2020 | Yabuta et al. | |

FOREIGN PATENT DOCUMENTS

| | | |
|---|---|---|
| JP | H09270428 A | 10/1997 |
| JP | 2010030280 A | 2/2010 |
| JP | 2011155286 A | 8/2011 |
| JP | 2013165117 A | 8/2013 |
| JP | 2014138042 A | 7/2014 |
| JP | 2015035459 A | 2/2015 |
| JP | 2017092168 A | 5/2017 |
| JP | 2017108192 A | 6/2017 |
| WO | WO-2008078746 A1 * | 7/2008 ........... H01L 21/563 |

OTHER PUBLICATIONS

International Search Report (with English Translation) and Written Opinion issued in corresponding International Patent Application No. PCT/JP2018/039659, 10 pages (dated Dec. 18, 2018).

* cited by examiner

POWER SEMICONDUCTOR DEVICE AND SUBSTRATE WITH DIMPLE REGION

TECHNICAL FIELD

The present invention relates to a power semiconductor device in which a semiconductor element is bonded to a substrate through use of a sintered metal bonding material, and a manufacturing method for the power semiconductor device.

BACKGROUND ART

In a power module serving as a power semiconductor device, a semiconductor element, for example, an IGBT or a diode is mounted as a switching element or a rectification element. Such a vertical semiconductor element is provided with an electrode on a back surface thereof obtained by metallizing an entire in-plane region and with an electrode obtained by metallizing a part of a top thereof facing the back-surface electrode. The following wiring structure is used to cause a large current to flow. That is, the back-surface electrode is connected to a substrate electrode, and the top electrode is connected to an external terminal via a wiring metal plate.

Meanwhile, from a viewpoint of a power loss reduction, a semiconductor element using a wide band gap semiconductor material, for example, silicon carbide (SiC) or gallium nitride (GaN) has been developed in recent years. In a case of such a semiconductor element using a wide band gap semiconductor material, the element has a high heat resistance and is capable of operating at a high temperature through use of a large current.

When the semiconductor element using the wide band gap semiconductor material is to exhibit the characteristic, a bonding material having high heat resistant property is required to form the wiring structure described above. However, at present, a lead-free solder material having high heat resistant property has not been found hitherto.

In view of this, a power module using, instead of a solder, a sintered metal bonding material that utilizes a sintering phenomenon of metal fine particles is studied. The sintered metal bonding material is a paste-like bonding material including metal fine particles, an organic solvent component, and a protective film covering the metal fine particles. The sintered metal bonding material utilizes a phenomenon in which the metal fine particles are sintered at a temperature lower than a melting point of a metal forming the metal fine particles so as to achieve metal bonding to a member to be bonded.

In a state after the bonding, the metal fine particles are diffusively bonded to each other, and metallization of an element and a top of a substrate to be mounted with the element are also diffusively bonded to each other. As a result, a melting point after the bonding increases to an intrinsic melting point of the metal. Accordingly, the sintered metal bonding material can have heat resistant property against a higher temperature than a temperature at the time of bonding.

Meanwhile, each of gold (Au), silver (Ag), and copper (Cu), which are generally well known as sintered metal bonding materials, has a heat conductivity higher than that of a solder. Accordingly, a bonding layer can be further thinned and consequently have higher heat radiation property.

An example of characteristic features of the sintered metal bonding material when a sintered metal bonding is formed is that, unlike in related-art solder bonding, a pressure application is typically required at the time of bonding. The sintered metal bonding has a problem in that, when an applied pressure required for the bonding is not given, an excellent bonding is not formed, with the result that a bonding life is degraded.

Accordingly, an approach for improving the bonding life is studied. For example, there has been proposed a related-art technique that forms unevenness in a top of a substrate to be bonded to increase a bonding area, and also elongates a crack extension path, to thereby improve the bonding life (see, for example, Patent Literature 1).

In addition, a method of improving the bonding life by increasing an applied pressure to form a solid bonding layer is also used. However, due to the increased applied pressure, a damage caused to a semiconductor element also increases to increase a risk in that the semiconductor element breaks down. Accordingly, when a pressure is applied to a semiconductor element, there is used a method of reducing the damage by using a cushion material to apply the pressure to the semiconductor element (see, for example, Patent Literature 2).

Further, there is also used a method of improving a heat resistance and a durability by forming a groove in a top of a substrate through, for example, press work, etching work, or cutting work (see, for example, Patent Literature 3).

CITATION LIST

Patent Literature

[PTL 1] JP 2015-35459 A
[PTL 2] JP 2017-108192 A
[PTL 3] JP 2017-92168 A

SUMMARY OF INVENTION

Technical Problem

However, the related-art technique has a problem as described below.

In the bonding structure illustrated in FIG. 1 of Patent Literature 1, as a result of increasing a surface roughness of a bonding member, the pressure applied at the time of bonding becomes higher in a middle portion than in both sides thereof, and accordingly becomes non-uniform. Consequently, a life of a bonding in each of parts to which a lower pressure is applied is reduced. As also illustrated in FIG. 3 of Patent Literature 1, the increased roughness has led to a higher increase rate of a crack area ratio.

In Patent Literature 1, the formation of a rough surface has increased a bonding area. However, in Patent Literature 1, a shortage of the applied pressure is likely to occur in the bonding layer, and, when the applied pressure is insufficient, the bonding life is reduced. Also, in Patent Literature 1, when the pressure applied at the time of bonding is increased to compensate for the applied pressure shortage, the semiconductor element may consequently break down.

When the cushion material is used to suppress a damage resulting from a pressure application as in Patent Literature 2, a problem occurs in that the cushion material is deformed to displace the semiconductor element. Therefore, it is required to secure a bonding strength so as to prevent the semiconductor element from being displaced. In securing the bonding strength, it is effective to increase the bonding area, or to form unevenness, which achieves an anchoring effect.

In patent Literature 3, the groove is formed in the top of the substrate by, for example, press work, etching work, or cutting work to improve the heat resistance and the durability. However, Patent Literature 3 includes no description related to the bonding strength.

As also illustrated in FIG. 5 of Patent Literature 3, the groove is formed in parallel with an outer edge of the semiconductor element 3. Consequently, directions in which the anchoring effect is achieved are only a lateral direction (X) and a vertical direction (Y) in plan view, and an effect of improving the bonding strength against a force in a rotating direction (θ) cannot be expected.

How the semiconductor element is displaced varies due to various factors, for example, a thickness of a sintered metal material, an inclination of a pressure application tool, and thicknesses of the substrate and the semiconductor element. Accordingly, it is difficult to predict displacement of the semiconductor element.

In the bonding of the semiconductor element through use of the sintered metal material, a pressure is applied at the time of bonding, while heat is applied. Consequently, a heat stress resulting from a heat expansion coefficient difference between the semiconductor element and the substrate develops at a bonding interface, and peeling is likely to occur. In addition, conveyance of the semiconductor element being mounted on the sintered metal material leads to the displacement of the semiconductor element.

The present invention has been achieved to solve the problems described above, and an object of the present invention is to obtain a power semiconductor device having a high bonding strength and an excellent bonding life, and a manufacturing method for the power semiconductor device.

Solution to Problem

According to the present invention, there is provided a power semiconductor device including: a substrate; and a semiconductor element bonded onto a first surface of the substrate through use of a sintered metal bonding material, the substrate having a plurality of dimples formed by laser processing in the first surface, the plurality of dimples being located outside a location immediately below a heat generation unit of the semiconductor element and located immediately below the semiconductor element.

Further, according to the present invention, there is provided a manufacturing method for a power semiconductor device that includes a semiconductor element bonded onto a first surface of a substrate through use of a sintered metal bonding material, the manufacturing method including: a first step of forming, by laser processing in the first surface of the substrate, a plurality of dimples having a depth of from 0.5 μm to 10 μm, the plurality of dimples being located outside a location immediately below a heat generation unit of the semiconductor element and immediately below the semiconductor element; a second step of supplying a sintered metal bonding material onto the substrate after the formation of the plurality of dimples; a third step of supplying the semiconductor element onto the sintered metal bonding material; and a fourth step of applying heat and a pressure to the semiconductor element on the sintered metal bonding material to bond the semiconductor element onto the first surface by sintered metal bonding.

Advantageous Effects of Invention

According to the present invention, the power semiconductor device has a structure in which the dimples are formed by the laser processing outside a location immediately below the heat generation unit of the semiconductor element and immediately below the semiconductor element as regions at which the peeling of the bonding layer does not affect a heat radiation property, to thereby increase a bonding area and achieve the anchoring effect in all directions. Thus, a bonding strength between the substrate and the sintered metal bonding material is improved, and, even when peeling of the bonding layer occurs, the peeling is prevented from extending to the location immediately below the heat generation unit of the semiconductor element and prevented from degrading the heat radiation property. Therefore, it is possible to obtain the power semiconductor device having an improved bonding strength as well as an improved product life and a manufacturing method for the power semiconductor device.

DESCRIPTION OF EMBODIMENTS

A power semiconductor device and a manufacturing method for the power semiconductor device according to exemplary embodiments of the present invention are described below with reference to the accompanying drawings.

First Embodiment

Figure 1:
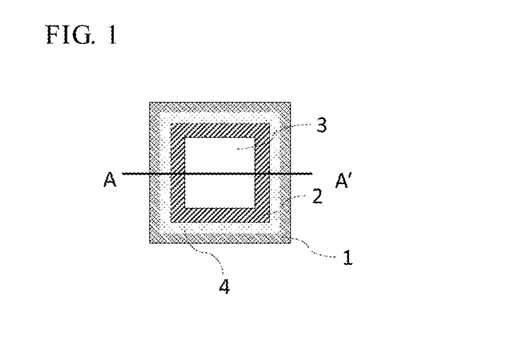
FIG. 1 is a schematic diagram for selectively illustrating a part of a power module in a first embodiment of the present invention.
Figure 2:
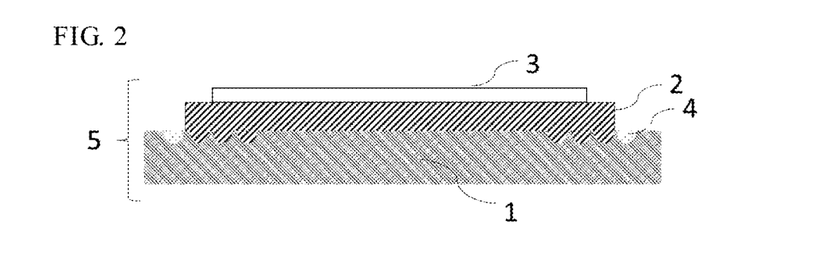
FIG. 2 is a sectional view taken along the line A-A' of FIG.

FIG. 1 is a schematic diagram for selectively illustrating a part of a power module in a first embodiment of the present invention. FIG. 2 is a sectional view taken along the line A-A' of FIG. 1. In a power module 5, a semiconductor element 3 is bonded onto a substrate 1 through use of a sintered metal bonding material 2. A top of the substrate 1 has dimples 4 configured to achieve an anchoring effect.

As a material of the semiconductor element 3, a so-called wide band gap semiconductor material having a band gap wider than that of silicon, for example, silicon (Si), silicon carbide (SiC), gallium nitride (GaN), or diamond can be used appropriately. A device type of the semiconductor element 3 is not required to be particularly limited, but a switching element, for example, an IGBT or a MOSFET or a rectification element, for example, a diode can be mounted.

As the semiconductor element 3, a rectangular semiconductor element having sides of, for example, from about 5 mm to about 20 mm is used. For example, when silicon (Si) is used for the semiconductor element 3 functioning as the switching element or the rectification element, the semiconductor element 3 is lower in cost than when silicon carbide (SiC), which has been increasingly applied to sintered metal bonding, is used for the semiconductor element 3. As a result, it is possible to reduce cost of the power module.

The sintered metal bonding has a heat radiation property higher than that of related-art solder bonding. Accordingly, the semiconductor element can operate at a high temperature. However, silicon (Si) is lower in bending strength and hardness than silicon carbide (SiC). As a result, when silicon (Si) is used, it is required to reduce a pressure applied at the time of sintered metal bonding than when silicon carbide (SiC) is used and accomplish bonding, while preventing damage to the semiconductor element.

Figure 3:
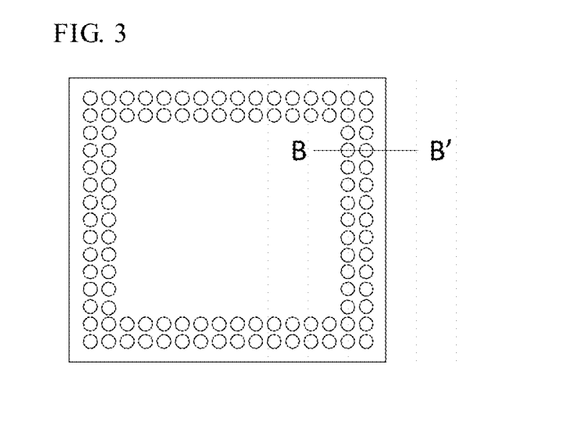
FIG. 3 is a detailed view of a top of a substrate in the first embodiment of the present invention.
Figure 4:
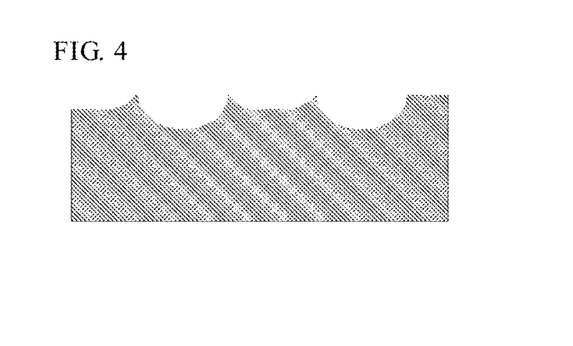
FIG. 4 is a sectional view taken along the line B-B' of FIG. 3.

In the first embodiment, silicon (Si) is used as the material of the semiconductor element 3. Further, in the first embodiment, the semiconductor element 3 having a size of 15×15 mm and a thickness of 0.15 mm was used. FIG. 3 is a detailed view of a top of the substrate 1 according to the first embodiment of the present invention. FIG. 4 is a sectional view taken along the line B-B' of FIG. 3. As illustrated in FIG. 3 and FIG. 4, the dimples 4 in the substrate 1 are the plurality of dimples 4 each formed through use of a Yb fiber laser into a linear shape as a dimple shape to have a diametrical dimension of from 10 μm to 100 μm and a surface roughness of from 1 μm to 3 μm.

Note that, according to a result of an experiment, a preferred diameter of the dimple shape is 40 μm±10 μm, and a preferred surface roughness (Rz JIS) is from 0.5 μm to 10 μm. As a method of forming the dimples 4, laser processing is preferred since the laser processing has high positional accuracy in forming the dimples 4 and allows easy formation thereof. Specifically, it is preferred to apply, for example, a $CO_2$ laser or a YAG laser to the laser processing. Not only a linear arrangement of the dimples 4, but also, for example, a grid-like arrangement of the dimples 4 can achieve an effect of the present invention.

Examples of the substrate 1 to be mounted with the semiconductor element 3 include a metal substrate made of, for example, Cu or Al and a ceramic insulating substrate in which a conductive conductor layer using a normal metal, for example, Cu or Al is laminated on and fixed to an insulating ceramic, for example, $Al_2O_3$, $Si_3N_4$, or AlN. The conductor layer may be a single metal layer or may also be covered with a precious metal material, for example, Ag or Au.

In the first embodiment, the substrate 1 formed by bonding a Cu conductor layer to each of both surfaces of $Si_3N_4$ through use of a brazing material was used. A thickness of $Si_3N_4$ used herein is set to 0.3 mm, and a thickness of a Cu plate used herein is set to 0.4 mm A top of Cu is plated with Ag (not shown) having a thickness of from 0.2 μm to 5.0 μm.

Note that, respective linear expansion coefficients of the semiconductor element 3 and $Si_3N_4$ are about 3 ppm/° C., and a linear expansion coefficient of Cu is 17 ppm/° C. As a result, when the thickness of the Cu plate increases, a linear expansion coefficient of the entire substrate 1 increases, with the result that a stress and a strain that are applied to each of the semiconductor element 3 and the sintered metal bonding material 2 are increased. Accordingly, the Cu plate having a smaller thickness can further improve the bonding life.

Note that, an effect of improving a bonding strength between the substrate 1 and the sintered metal bonding material 2 according to the present invention is achieved irrespective of a material of the substrate 1, for example, Si, $Si_3N_4$, or Cu or thicknesses of the semiconductor element 3 and the substrate 1.

A description is given of bonding using the sintered metal bonding material. The sintered metal bonding material has a high reactivity due to nanometer-level metal fine particles that occupy an extremely large surface area and have high surface energy. Accordingly, the bonding using the sintered metal bonding material utilizes a phenomenon in which, due to a temperature of a metal that is lower than a melting point exhibited by the metal in a bulk state, metal bonding is promoted by diffusion.

The metal fine particles serving as an aggregate may be made of a single-element metal classified into a precious metal, for example, gold (Au), silver (Ag), copper (Cu), palladium (Pd), or platinum (Pt) or may also have an alloy composition, for example, an Ag—Pd, Au—Si, Au—Ge, or Au—Cu composition. Due to high reactivities of the metal fine particles, mere contact between the metal fine particles advances sintering, namely, diffusive bonding of the metal fine particles even at a room temperature. Accordingly, in the sintered metal bonding material, the metal fine particles are covered with an organic protective film to be prevented from adhering to each other and advancing a sintering reaction.

Further, the metal fine particles are held by an organic dispersant for dispersively holding the metal fine particles in an independent state. In other words, the sintered metal bonding material is in the form of a paste in which the metal fine particles serving as the aggregate are dispersed in an organic component. After bonding of the sinter bonding material containing such metal nano particles, a volume of a bonding decreases to from about ½ to about ¼ of an initial volume of the paste-like sinter bonding material due to decomposition of the organic component and to sintering of the nano particles.

Accordingly, to obtain the highly reliable bonding with fewer voids, it is required to heat the sinter bonding material at the time of bonding, while applying a pressure thereto. Thus, in a case of using a sinter bonding technique, a semiconductor device structure capable of allowing a pressure to be applied to the bonding (sintered metal bonding material) is required.

In the first embodiment, as the sintered metal bonding material 2, an Ag sinter material was used. As bonding conditions, a bonding temperature, an applied pressure, and a bonding period serve as main parameters that determine a bonding force. An example of various conditions in sintering using Au, Ag, or Cu for the metal fine particles is shown below.

<Drying Conditions>
  Temperature: From 80° C. to 200° C.
  Period: From 1 minute to 60 minutes.
<Provisional Fixing Conditions>
  Temperature: From 25° C. to 200° C.
  Applied Pressure: From 0.01 MPa to 5 MPa.
  Period: From 0 minutes to 1 minute.
Bonding Conditions>
  Temperature: From 250° C. to 350° C.
  Applied Pressure: From 0.1 MPa to 50 MPa.
  Bonding Period: From 1 minute to 60 minutes.

Note that, those conditions are various conditions for the typical sintered metal bonding material 2. In other words, it is to be understood that the power module 5 of the present invention is not required to be manufactured under those conditions.

Figure 5:
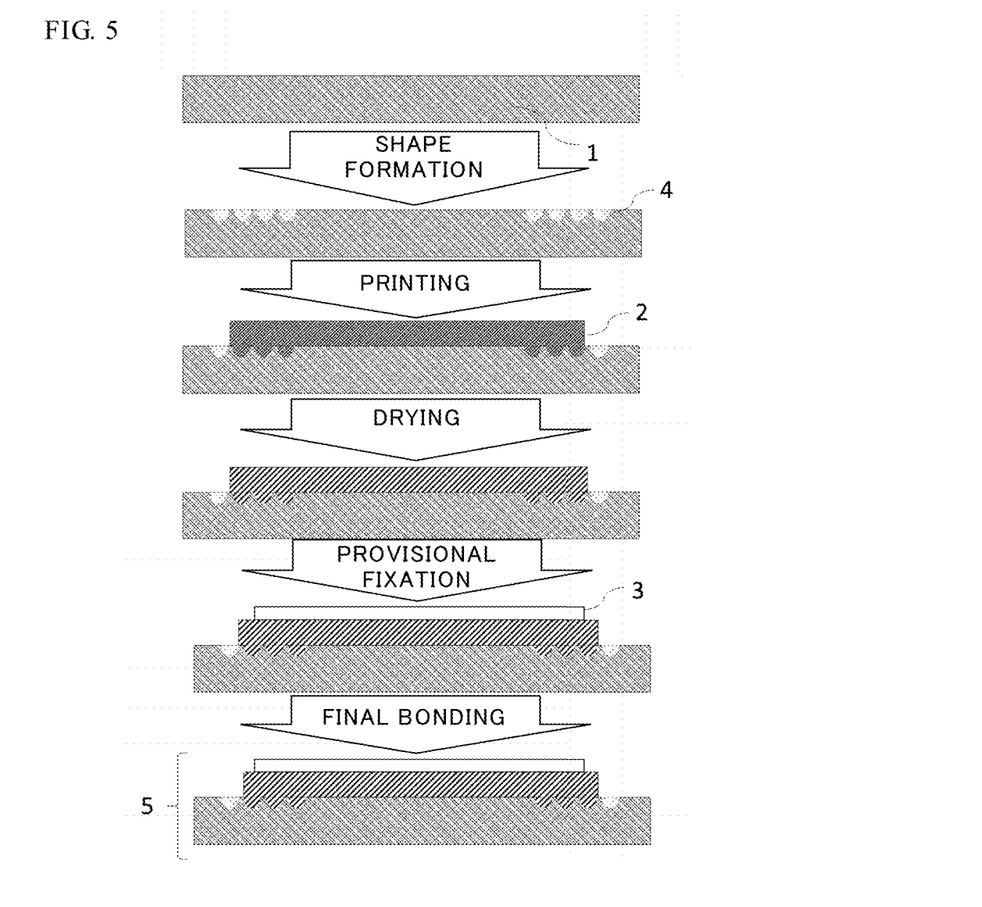
FIG. 5 is a view for illustrating an example of a process of manufacturing the power module in the first embodiment of the present invention.

FIG. 5 is a view for illustrating an example of a process of manufacturing the power module 5 in the first embodiment of the present invention. By way of example, the process of manufacturing the power module 5 in the first embodiment includes five steps as illustrated in FIG. 5.

<Step 1> Shape Formation Step
In the top of the substrate 1, the dimples 4 are formed to achieve the anchoring effect through use of a laser.

<Step 2> Printing Step
The sintered metal bonding material 2 is printed on the substrate 1 to a thickness of from 30 μm to 200 μm.

<Step 3> Drying Step
Under the conditions described above, the sintered metal bonding material 2 is dried.

<Step 4> Provisional Fixation Step
Under the conditions described above, the semiconductor element 3 is mounted on the sintered metal bonding material 2 to be provisionally fixed thereto.

<Step 5> Final Bonding Step
Under the conditions described above, the substrate 1 and the semiconductor element 3 are bonded to each other through use of the sintered metal bonding material 2. Note that, in the first embodiment, the sintered metal material 2 is supplied by printing, but may also be supplied by another supply method.

Then, after the semiconductor element 3 is bonded to the substrate 1 through use of the sintered metal bonding material 2, a lead electrode (not shown) is connected onto the semiconductor element 3 by solder bonding. At this time, the bonding of the sintered metal bonding material 2 has been already completed. Consequently, a temperature rise of about 300° C. at the time of solder bonding does not cause an adverse effect, for example, remelting of the sintered metal bonding material 2.

After the lead electrode is solder-bonded onto the semiconductor element 3, a frame (not shown) surrounding the entire substrate is bonded to the substrate 1 through use of an adhesive. Then, a gel resin is injected into the frame to seal a periphery of the semiconductor element 3 and cured to thereby achieve a power module bonded body.

Note that, in the first embodiment, sealing is performed through use of the gel resin. However, the present invention is not limited to such sealing. The periphery of the semiconductor element 3 may also be sealed with a resin by another method, for example, sealing by silicone potting or mold forming. Depending on circumstances, it is not required to seal the semiconductor element 3 with a resin.

Figure 6:
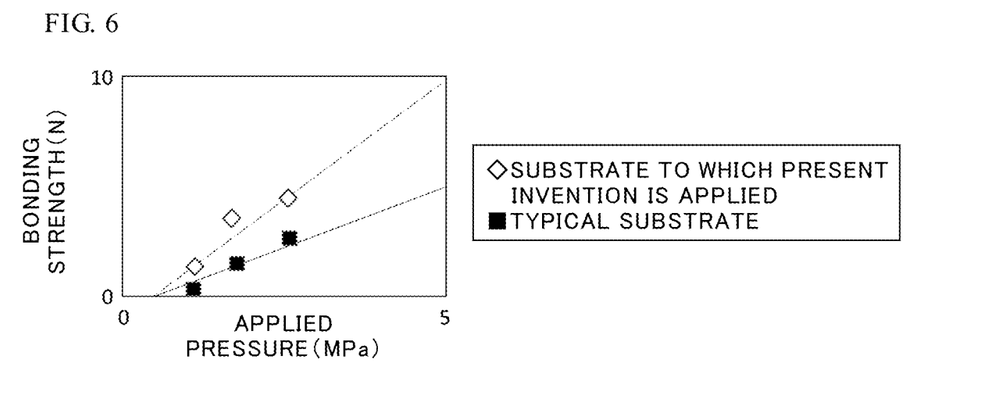
FIG. 6 is a graph for showing an effect of improving a bonding strength in the first embodiment of the present invention.

FIG. 6 is a graph for showing an effect of improving the bonding strength in the first embodiment of the present invention. Specifically, FIG. 6 is a schematic graph for showing variations in bonding strengths when manufacturing steps up to a provisional fixation step were performed on each of a typical substrate and the substrate 1 having a structure according to the present invention in accordance with the manufacturing process described above.

In the substrate 1 according to the first embodiment having the dimple shapes, due to an anchoring effect, an improvement is observed in bonding strength. When the bonding strength of the provisional fixation is low, the semiconductor element is displaced during conveyance of the substrate or at the time of final bonding in a subsequent step. The displacement causes a problem in that assembly cannot be performed or a problem in that the semiconductor element 3 protrudes from over the sintered metal bonding material 2, and the resulting step causes breakdown of the semiconductor element 3. The substrate 1 according to the first embodiment has the bonding strength of the provisional fixation that is higher than that of the typical substrate. Therefore, it is possible to prevent such problems.

Figure 7:
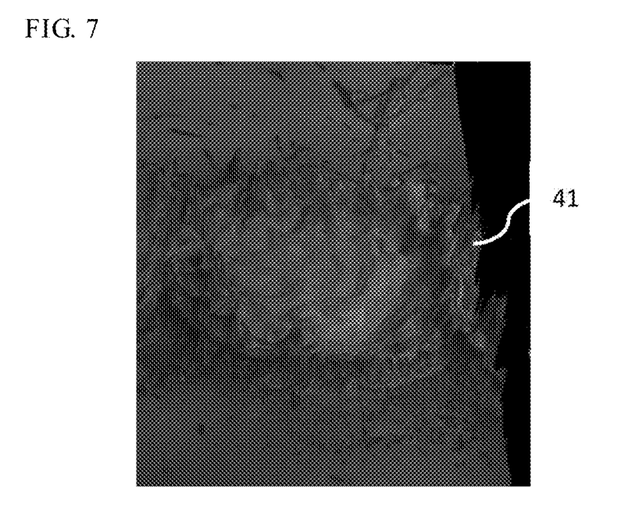
FIG. 7 is a three-dimensional measurement view of dimples formed through use of a laser in the first embodiment of the present invention.

FIG. 7 is a three-dimensional measurement view of the dimples 4 formed by laser processing. As a result of the formation of the dimples through use of a laser, an irradiated part is melted and scattered to adhere to a surrounding part. Due to the adhesion, unevenness is formed in all directions around the dimples to enable the anchoring effect to be achieved not only in planar directions (X-direction and Y-direction), but also in a rotating direction (θ-direction).

Figure 8:
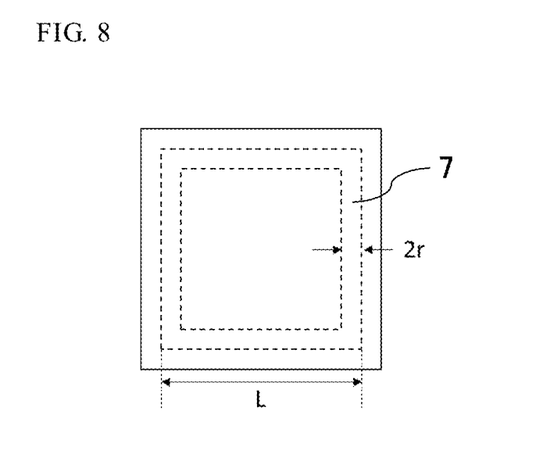
FIG. 8 is a view for illustrating a region in which a groove shape or a dimple shape is formed in the first embodiment of the present invention.

In the formation of unevenness for increasing a bonding area, by forming the dimple shapes, not a groove, it is possible to further increase the area thereof. FIG. 8 is a view for illustrating a region in which a groove shape or the dimple shapes are formed in the first embodiment of the present invention. As illustrated in FIG. 8, of a square region having sides each having a length L, a region 7 having a width 2r is considered. A surface area A of the region 7 before processing is given by Expression (1) below.

$$A = 2r \times 4L = 8rL \tag{1}$$

Figure 9:
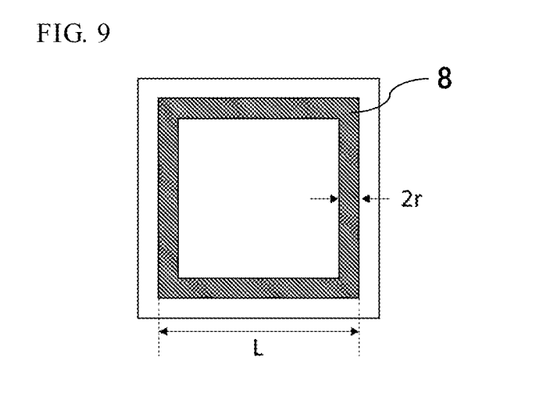
FIG. 9 is a view for illustrating a state in which a semicircular groove is formed in a region 7 illustrated in FIG. 8.

FIG. 9 is a view for illustrating a state in which a semicircular groove 8 is formed in the region 7 illustrated in FIG. 8. When the semicircular groove having a radius r is formed by, for example, cutting to have sides each having the length L, a surface area B of the semicircular groove 8 illustrated in FIG. 9 is given by Expression (2) below.

$$B = \pi r \times 4L = 4\pi rL \tag{2}$$

Figure 10:
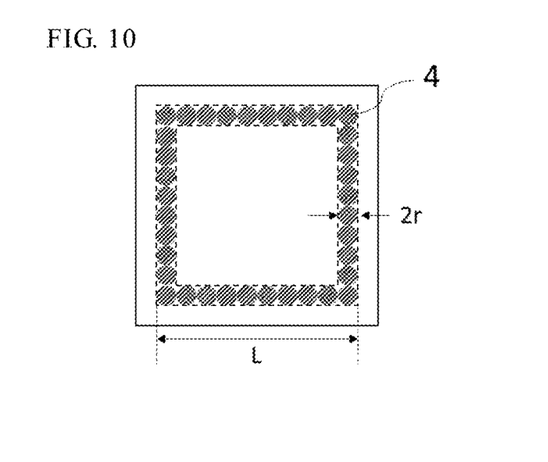
FIG. 10 is a view for illustrating a state in which dimples each having a radius r are formed in the region 7 illustrated in FIG. 8.

Meanwhile, FIG. 10 is a view for illustrating a state in which the dimples 4 each having the radius r are formed in the region 7 illustrated in FIG. 8. A surface area "a" of each one of the dimples having the radius r and formed through use of the laser processing is given by Expression (3) below.

$$a = \frac{4\pi r^2}{2} = 2\pi r^2 \tag{3}$$

When the dimples 4 are gaplessly formed herein in the region 7 having sides each having the length L as illustrated in FIG. 10, the number n of the dimples is given by Expression (4) below.

$$n = \frac{2L}{r} \quad (4)$$

Accordingly, a total surface area C of the n dimples is given by Expression (5) below.

$$C = a \times n = 4\pi rL \quad (5)$$

In addition, an area D around the dimples can be represented by a value obtained by subtracting, from the surface area A, an area C' of the dimples in plan view. In other words, C' is given by Expression (6) below, and D is given by Expression (7) below.

$$C' = \pi r^2 \times \frac{2L}{r} \quad (6)$$

$$D = A - C' = 8rL - \left(\pi r^2 \times \frac{2L}{r}\right) = rL(8 - 2\pi) \quad (7)$$

An increase rate of the surface area when the groove 8 is formed in the region 7 is B/A, which is given by Expression (8) below.

$$\frac{B}{A} = \frac{4\pi rL}{8rL} = 1.57 \quad (8)$$

Meanwhile, an increase rate of the surface area when the dimples 4 are formed in the region 7 is (C+D)/A, which is given by Expression (9) below.

$$\frac{C+D}{A} = \frac{4\pi rL + (8-2\pi)rL}{8rL} = 1.79 \quad (9)$$

Compared to the surface area when the groove shape is formed, the surface area when the dimple shapes are formed is increased to 1.14 (1.79/1.57=1.14) times the surface area of the groove shape. In addition, the unevenness formed around the dimples 4 due to adhesion of a base material to the peripheries of the dimples 4 also contributes to a bonding area.

A volume of the unevenness formed at this time results from the base material melted at the time of formation of the dimples 4, and therefore the volume of the unevenness is equal to a volume of the dimples 4. Accordingly, when it is assumed that a surface area of the unevenness is equal to a surface area of the dimples, the increase rate of the surface area when the dimples 4 are formed in the region 7 in consideration also of the contribution of the unevenness to the bonding area is (2C+D)/A, which is given by Expression (10) below.

$$\frac{2C+D}{A} = \frac{8\pi rL + (8-2\pi)rL}{8rL} = 3.35 \quad (10)$$

Accordingly, compared to the surface area of the groove 8, the surface area of the dimples 4 formed through use of the laser processing is 2.13 (3.35/1.57=2.13) times the surface area of the groove 8, which is equal to or more than double the surface area of the groove 8. Moreover, the unevenness is formed in all directions, and therefore the sufficient anchoring effect in the rotating direction (θ-direction) is achieved.

Figure 11:
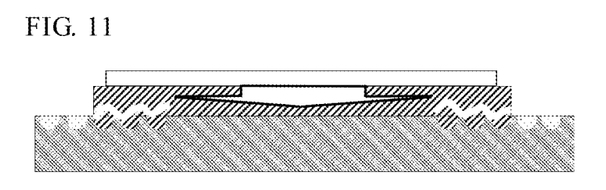
FIG. 11 is a sectional view for illustrating a result of a heat cycle test related to the power module of the first embodiment of the present invention.

FIG. 11 is a sectional view for illustrating a result of a heat cycle test related to the power module in the first embodiment of the present invention. Specifically, in FIG. 11, there is illustrated a result of 2,000 cycles of the heat cycle test, each of which was performed at from −40° C. to 150° C. for fifteen minutes with respect to the power module according to the first embodiment produced by the manufacturing process described above.

As illustrated in FIG. 11, at a location with the dimples 4 to which the present invention is applied, due to the unevenness of the substrate 1, a part in which the bonding strength of the sintered metal bonding material 2 is low is formed. As a result, at each of the locations with the dimples 4, a crack has extended.

However, the crack formed in the sintered metal bonding material 2 over each of the dimples 4 is located in an outer periphery of the heat generation unit of the semiconductor element 3 and is located outside a heat radiation path. Accordingly, as indicated by an arrow illustrated in FIG. 11, the heat radiation property does not deteriorate. Consequently, the formation of the dimples 4 does not cause an adverse effect on performance.

Meanwhile, it was successfully confirmed that the sintered metal bonding material 2 and the semiconductor element 3, which were located immediately below the heat generation unit of the semiconductor element 3, did not undergo a damage, for example, a crack. Thus, the power module according to the first embodiment in which the bonding strength is improved does not cause an adverse effect, for example, degradation of the heat radiation property, and a function of the power module is not impaired.

Note that, the heat generation unit of the semiconductor element 3 is typically located in a region inside a guard ring.

Thus, according to the first embodiment, the dimples are formed in a region outside a location immediately below the heat generation unit of the semiconductor element as the region in which the peeling of a bonding layer does not affect the heat radiation property. In the power module according to the first embodiment having such a structure, the anchoring effect achieved by the dimples can improve the bonding strength between the substrate and the sintered metal bonding material.

In addition, in the power module according to the first embodiment, even when the peeling of the bonding layer occurs, the peeling is prevented from extending to a location immediately below the heat generation unit of the semiconductor element and degrading the heat radiation property. As a result, it is possible to implement the power module configured to simultaneously improve the bonding strength and a product life.

In other words, the power module according to the first embodiment can allow the surface roughness of the substrate to exert the anchoring effect and improve the bonding strength between the substrate and the sintered metal bonding material in a dry state. Meanwhile, when there are the surface roughness and the unevenness, the bonding layer is formed to have locally coarse and dense parts, and consequently a crack is likely to extend.

However, when a location at which the crack is formed is outside the heat generation unit of the semiconductor element, the bonding life is less affected thereby. From this viewpoint, in the power module according to the first embodiment, the plurality of dimples are provided outside a location immediately below the heat generation unit of the semiconductor element. By using such a structure, it is possible to locate a starting point of crack extension in the bonding material and reduce a damage to the semiconductor element.

In addition, the dimples are formed to extend to the outside of a region in which the substrate and the semiconductor element are bonded to each other. As a result, by enlarging a range in which the dimples are present, it is possible to enlarge a range in which the anchoring effect is achieved and increase the bonding strength.

The shapes of the dimples can be configured to be in parallel with an outer shape of the semiconductor element and linear so as to alternately form a plurality of dimple portions and unrecessed portions. By forming the dimples in such linear shapes, it is possible to reduce a speed of crack extension into the semiconductor element around the entire circumference thereof, compared to that in a case of the entire bonding layer being roughened. As a result, it is possible to improve the life of the bonding.

Note that, for an improvement in the bonding strength between the substrate and the sintered metal, the effect of improving the bonding strength based on the anchoring effect is achieved not only when sinter bonding is completed, but also in a dry state achieved by drying an unrequired solvent after the sintered metal bonding material is supplied onto the substrate in the middle of the process.

The sintered metal bonding method is characterized by an example in which a step of positioning the semiconductor element and provisionally fixing the semiconductor element is selected before final bonding that completes the sinter bonding. Also in this case, it is possible to increase the bonding strength between the substrate and the sintered metal bonding material through use of the rough surface equivalent to the dimples formed in the substrate.

In addition, the dimples are not formed immediately below the heat generation unit of the semiconductor element. Accordingly, it is possible to reduce a pressure applied at the time of final bonding and prevent breakdown of the semiconductor element due to the pressure applied at the time of bonding. As a result, it is possible to implement the sintered metal bonding that can secure the bonding strength without degrading the product life.

Second Embodiment

As a material of an outermost surface of the substrate 1 used in the power module 5, which is to be bonded, a precious metal, for example, Ag or Au is applicable with no problem. However, in the second embodiment, a description is given of a case in which Cu is selectively determined as the material of the outermost surface.

When the material of the outermost surface is Cu, formation of a natural oxide coating is promoted by leaving the substrate 1 to stand in atmospheric air. Consequently, the sintered metal bonding is adversely affected. To achieve a solid sintered bonding, it is preferred that, for example, an oxide coating and a foreign material be not present at an interface between the top of the substrate 1 and the sintered metal bonding material, and metal atoms be brought in direct contact with each other.

Accordingly, in the second embodiment, a newly formed surface of the substrate 1 is exposed before a material is supplied, to thereby be able to improve a bonding strength. However, formation of a natural oxide coating proceeds even after the newly formed surface was exposed and before the material is supplied. Therefore, it is preferred that a time period after the newly formed surface was exposed and before the material is supplied be as short as possible.

Figure 12:
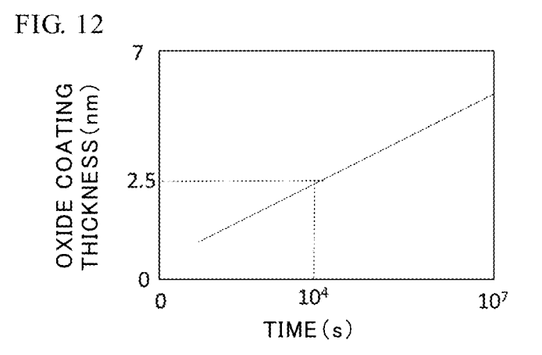
FIG. 12 is a graph for schematically showing a variation with time of a thickness of an oxide film on a Cu surface in a second embodiment of the present invention.
Figure 13:
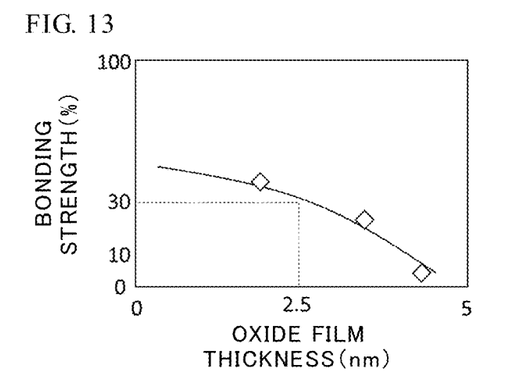
FIG. 13 is a graph for schematically showing a relationship between a thickness of the Cu oxide film and a bonding strength when a semiconductor element is provisionally fixed in the second embodiment of the present invention.

In the second embodiment, the time period after Yb fiber laser processing and before the supply of the material is set to be equal to or less than 30 seconds. It is preferred that the time period after the laser processing and before the supply of the material be equal to or less than 10,000 seconds. This is based on, for example, a relationship between formation of an oxide film and a bonding strength. FIG. 12 is a graph for schematically showing a variation with time of a thickness of an oxide coating on a Cu surface in the second embodiment of the present invention. FIG. 13 is a graph for schematically showing a relationship between a thickness of a Cu oxide film and a bonding strength when a semiconductor element is provisionally fixed in the second embodiment of the present invention.

When the oxide coating is thin, it is possible to ensure a high bonding strength. However, as the oxide coating becomes thicker, the degradation of the bonding strength is observed. As can be understood from FIG. 12 and FIG. 13, it is preferred to set the oxide coating thickness to a value equal to or less than 2.5 nm so as to secure a fixation strength. This is because a natural oxide coating reaches a thickness of 2.5 nm in 10,000 seconds.

When the sintered metal bonding material contains a reducing agent for removing the oxide coating, it is possible to prolong the time after the laser processing and before the supply of the material. However, in general, the reducing agent hampers the sintered metal bonding. Therefore, it is not preferred that the sintered metal bonding material contain a reducing agent. Even when the sintered metal bonding material contains a reducing agent, it is preferred that an amount of the contained reducing agent be as small as possible.

Thus, according to the second embodiment, even when the material of the outermost surface of the substrate is Cu, the newly formed surface is exposed before the material is supplied, and the time period from the exposure of the newly formed surface to the supply of the material is reduced, to thereby achieve an appropriate bonding strength.

In addition, by forming the dimples immediately before the sintered metal bonding material is supplied, it is also possible to remove a material on the top of the substrate that hampers the bonding, for example, a metal oxide film or an antirust agent. In terms of being able to expose the newly formed surface of the substrate as well, it is possible to improve the bonding strength between the substrate and the sintered metal bonding material.

Third Embodiment

Figure 14:
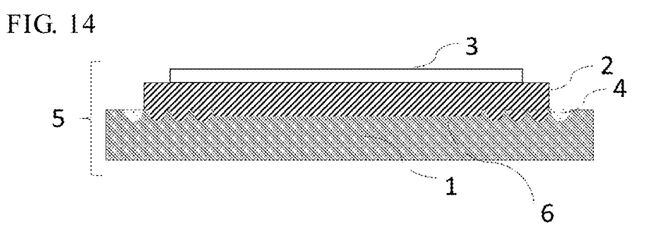
FIG. 14 is a schematic diagram for selectively illustrating a part of a power module in a third embodiment of the present invention.

FIG. 14 is a schematic diagram for selectively illustrating a part of a power module in a third embodiment of the present invention. In the power module 5, the semiconductor element 3 is bonded onto the substrate 1 through use of a sintered metal bonding material 2. The top of the substrate 1 has a surface roughness that differs from one region to another. The substrate 1 has a structure in which the region 6 on the substrate 1 located immediately below the heat generation unit of the semiconductor element 3 has a lower surface roughness, and a periphery thereof has a higher surface roughness due to the dimples 4 formed therein.

In the third embodiment, processing using a Yb fiber laser is performed on the region 6 of the substrate 1 located immediately below the heat generation unit and on the rough surface 4 in the periphery thereof. The surface roughness of the region 6 located immediately below the heat generation unit after the processing was controlled to from 0 μm to 0.3 μm, and depths of the dimples 4 in the periphery thereof were controlled to from 1 μm to 3 μm. It is preferred that the surface roughness of the region 6 located immediately below the heat generation unit be from 0 μm to 0.5 μm, and the surface roughnesses of the dimples 4 in the periphery thereof be from 0.5 μm to 10 μm.

Note that, in the third embodiment, for the sake of simplicity of processing, processing was simultaneously performed, while using the same Yb fiber laser in all processing regions and varying laser conditions (for example, an output, a spot diameter, and a scanning speed) depending on the processing regions. However, even when the region 6 immediately below the heat generation unit and the dimples 4 in the periphery thereof are implemented through use of another method or another process, for example, a $CO_2$ laser or grinding, as long as the same shape is formed, the effect of the present invention is achieved.

In the region 6 of the substrate 1 located immediately below the heat generation unit, an oxide coating, a foreign material, and a chemical compound are present, to thereby hamper the sintered metal bonding. Accordingly, by roughening the substrate surface before a supply of a material, it is possible to remove factors that hamper the sinter bonding and ensure a high bonding strength.

When a Cu material is used in the top of the substrate 1, the Cu material is naturally oxidized after the oxide coating is removed. Accordingly, when the oxide film at a time at which the sintered metal bonding material 2 is supplied onto the substrate 1 is thinner than that prior to a roughening process, the oxide coating more advantageously functions to improve the bonding strength.

Figure 15:
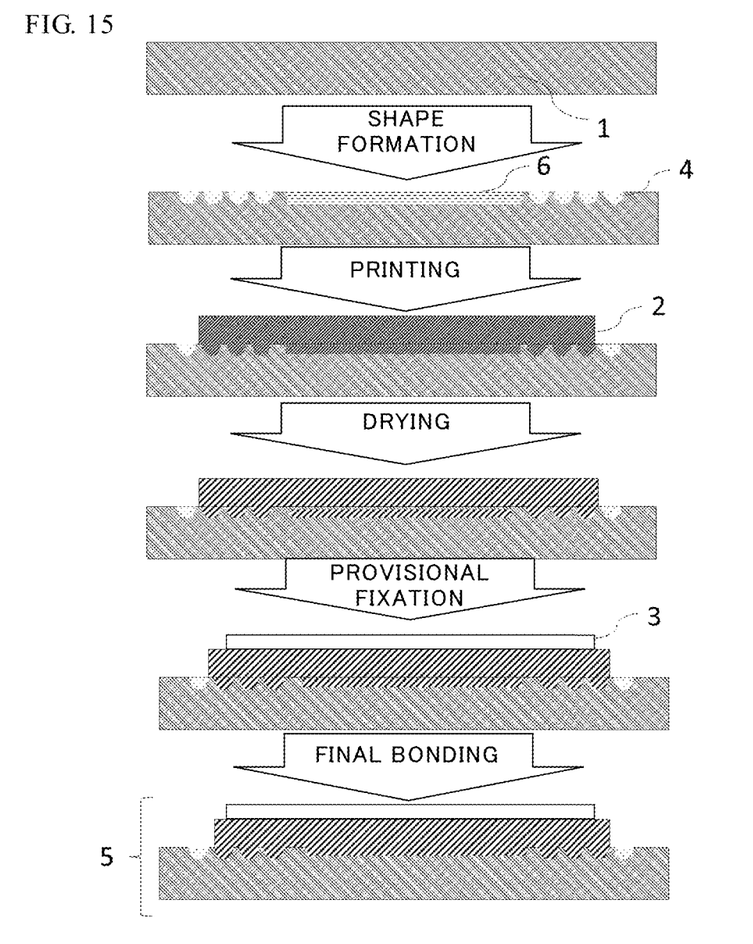
FIG. 15 is a view for illustrating an example of a process of manufacturing the power module in the third embodiment of the present invention.

FIG. 15 is a view for illustrating an example of a process of manufacturing the power module 5 in the third embodiment of the present invention. By way of example, the process of manufacturing the power module 5 in the third embodiment includes five steps as illustrated in FIG. 15. Note that, various conditions are the same as those described in the first embodiment.

<Step 1> Shape Formation Step

In the region 6 of the substrate 1 immediately below the heat generation unit of the semiconductor element 3 and in a peripheral region thereof having the dimples 4, different surface roughnesses are simultaneously achieved.

<Step 2> Printing Step

The sintered metal bonding material 2 is printed on the substrate 1 to a thickness of from 30 μm to 200 μm.

<Step 3> Drying Step

Under the conditions described above, the sintered metal bonding material 2 is dried.

<Step 4> Provisional Fixation Step

Under the conditions described above, the semiconductor element 3 is mounted on the sintered metal bonding material 2 to be provisionally fixed thereto.

<Step 5> Final Bonding Step

Under the conditions described above, the substrate 1 and the semiconductor element 3 are bonded to each other through use of the sintered metal bonding material 2.

With a manufacturing method in the third embodiment, it is possible to simultaneously form the region 6 immediately below the heat generation unit of the semiconductor element 3 and the dimples 4 in the periphery thereof by the shape formation step in Step 1. As a result, it is possible to simplify the manufacturing method and reduce cost.

Thus, according to the third embodiment, the region immediately below the heat generation unit of the semiconductor element and the dimples that have the different surface roughnesses are simultaneously formed on the substrate. As a result, it is possible to reduce manufacturing cost of the power module having the improved bonding strength.

In the present invention, within the scope of claims, the embodiments can freely be combined, and each of the embodiments can appropriately be modified or omitted.

REFERENCE SIGNS LIST 1 substrate, 2 sintered metal bonding material (sintered metal bonding material), 3 semiconductor element, 4 dimple, 5 power semiconductor device (power module), 6 region located immediately below the heat generation unit, 7 region, 8 groove

The invention claimed is:

1. A power semiconductor device, comprising:
a substrate; and
a semiconductor element bonded onto a first surface of the substrate through use of a sintered metal bonding material,
the substrate having, in the first surface, a first region immediately below a heat generation unit of the semiconductor element and a second region including a region located immediately below the semiconductor element in plan view and outside the first region and a region located outside an end portion of the semiconductor element, the second region having dimples.

2. The power semiconductor device according to claim 1, wherein the dimples are formed in the first surface to extend to a location outside a region of the first surface in which the substrate and the semiconductor element are bonded to each other.

3. The power semiconductor device according to claim 1, wherein the dimples are formed to be arranged in a linear shape in parallel with an outer shape of the semiconductor element.

4. The power semiconductor device according to claim 1, wherein silicon is used as a material of the semiconductor element.

5. The power semiconductor device according to claim 1, wherein the heat generation unit of the semiconductor element is located in a region on an inner side of a guard ring of the semiconductor element in plan view.

6. The power semiconductor device according to claim 1, wherein the dimples are a plurality of dimples each of which has a surface roughness of from 0.5 μm to 10 μm.

7. The power semiconductor device according to claim 1, wherein the second region has dimples in the region located immediately below the semiconductor element in the plan view and outside the first region and in the region located outside the end portion of the semiconductor element.

* * * * *